United States Patent [19]
Holzmann

[11] Patent Number: 5,403,671
[45] Date of Patent: Apr. 4, 1995

[54] PRODUCT FOR SURFACE MOUNT SOLDER JOINTS

[75] Inventor: Damian J. Holzmann, Vero Beach, Fla.

[73] Assignee: Mask Technology, Inc., Santa Ana, Calif.

[21] Appl. No.: 42,202

[22] Filed: Apr. 2, 1993

Related U.S. Application Data

[62] Division of Ser. No. 881,872, May 12, 1992, Pat. No. 5,310,574.

[51] Int. Cl.$^6$ ................................................ B32B 3/30
[52] U.S. Cl. ................................ 428/601; 428/687; 174/261
[58] Field of Search ............... 428/601, 687, 614, 621, 428/623, 626, 608; 174/261, 263

[56] References Cited

U.S. PATENT DOCUMENTS

| | | | |
|---|---|---|---|
| 3,153,581 | 10/1964 | Hutchins | 428/608 |
| 3,167,490 | 1/1965 | Friedman | 174/261 |
| 3,214,564 | 10/1965 | Katzer et al. | 428/608 |
| 3,226,608 | 12/1965 | Coffin | 428/608 |
| 3,452,149 | 6/1969 | Rinaldi | 174/261 |
| 3,515,593 | 6/1970 | Nickols | 428/626 |
| 4,295,151 | 10/1981 | Nyul et al. | 357/68 |
| 4,678,531 | 7/1987 | Metzger et al. | 156/250 |
| 4,729,306 | 3/1988 | Bubley | 101/114 |
| 4,789,096 | 12/1988 | Dunn et al. | 228/179 |
| 5,051,339 | 9/1991 | Friedrich | 430/311 |

OTHER PUBLICATIONS

W. J. Maiwald "Reliable Reflow Soldering Techniques Using Preformed Solid Solder Deposits"–Part 2–The Assembly Process–no date.
M. Weinhold ". . . Part 1–The Printed Circuit Fabrication Process"–no date.

*Primary Examiner*—John Zimmerman
*Attorney, Agent, or Firm*—Richard T. Holzmann

[57] ABSTRACT

A printed circuit or hybrid circuit board with a formed solder deposit on a surface mount device (SMD) pad thereon, as well as for the formed solder deposit itself. This formed solder deposit is in a defined three-dimensional well having the proper profile and a defined solder gap. The solder before forming can be solid solder or a solder paste. By the placement of a mesh on the surface of the circuit board with the solder in place on the pads, applying a slight positive pressure on a rigid or elastic surface on the other side of the mesh or on the mesh itself, and subjecting this system to a temperature just low enough to reflow the solder by means of a heat transfer fluid, then cooling the board to solidify the solder, a product results having the above properties. The duration of the application of heat and pressure is made so brief, that the laminate structure of the board and the coating thereon remain substantially unaffected.

6 Claims, 5 Drawing Sheets

PRODUCT FOR SURFACE MOUNT SOLDER JOINTS

This is a division of application Ser. No. 07/881,872, filed May 12, 1992, and granted as U.S. Pat. No. 5,310,574 on May 10, 1994.

BACKGROUND INFORMATION

This invention relates to a printed circuit or hybrid circuit board with a formed solder deposit on a surface mount device (SMD) pad thereon, and for the formed solder deposit itself.

Various methods are known for applying solder selectively to printed circuit boards (PCBs) in such a way that following the assembly of the boards with SMD components, the boards can be electrically and mechanically connected to the components by reflow soldering methods.

In particular, the prior art uses a method in which solder is deposited on selected regions of the PCB by screen printing or stencil printing with soldering pastes. These selected regions of the PCB, the pads, have usually been hot air solder leveled leaving only a thin layer of solder inadequate to form a joint. Alternatively, the copper pads may have been treated with an anti-tarnish material which prevents oxidation of the copper promoting adhesion of solder thereto. Eventually, this anti-tarnish material burns off during subsequent heating.

This method is in common use today but there are many problems associated therewith. These problems are not only those associated with screen printing such as investment cost, wear, plugging, and resolution, but also the solder forms "bumps", that is, the solder has a more or less convex cross-sectional shape making placement difficult and contributing to rework. See FIG. 1 wherein (1) is a solder mask, (2) is solder, (3) laminate, and (4) a pad. Thin solder deposits are often produced with low or no mechanical and thermal load-bearing capacity for the solder connections.

Another conventional method is immersion application of solder wherein a prepared PCB, that is one having solder resist thereon, is dipped into and removed from a solder bath. After removal and cool down, the metallized regions of the PCB are provided with solder deposits, which, however, also suffer from the formation of "bumps". The height of the solder deposit is dependent on the dimensions in the plane of the PCB of the regions to which solder is to be applied, when such regions have different dimensions, solder deposits of variable height necessarily result.

U.S. Pat. No. 5,051,339 issued Sep. 24, 1991 to Friedrich et al., the so-called "OPTIPAD" process, is an attempt to overcome some of these disadvantages. This is an immersion process, thus there are no foreign ingredients, only solder in the solder deposits. This patentee points out that hot air or hot oil leveling is not considered to be close prior art, whereas immersion soldering without ensuing air leveling is.

The process involves a PCB having thereon a solder mask with pads exposed, laminating thereto a temporary photoimageable layer of perhaps 5 mil in thickness, exposing and developing so that everything is masked but the pads to be soldered, immersing the thus prepared PCB in molten solder, and then contacting the board with a closure element to maintain the solder in place until it solidifies thereby flattening it.

The coating of the PCB with a temporary top solder mask is indispensible to the invention. The closest prior art did not contain the step of covering, with at least one closure element at a defined contact pressure, the voids located above the regions to which solder is to be applied when filled in the soldering bath with liquid solder. Stripping the temporary layer leaves behind a flattened 5 mil high pillar of solder. Aside from the need for expensive equipment which is not commercially available, this process has two major problems: (1) when the costly temporary coating sees molten solder it cures extensively and is difficult to remove even when stripping with caustic soda which has the other effects of not only dulling and oxidizing the solder, but of attacking the permanent mask; (2) when the 5 mil solder mask is stripped it leaves pillars of solder which in fine pitch applications when mated with their components collapse and generate extensive shorts. Any attempt to reduce the thickness of the mask in order to reduce the height of these pillars results in a greater degree of curing and an even more difficult stripping operation.

Others are modifying this process by screening molten solder into the pad wells. Screening molten solder not only has the same problem but there is severe dulling of the solder probably shortening storage life due to intermetallic phase formation and oxidation.

In addition to the '339 patent mentioned above, there are two other relevant publications; a paper by W. J. Maiwald of Siemens entitled, "Reliable Reflow Soldering Techniques using Preformed Solid Solder Deposits, Part 2—The Assembly Process" and the associated paper by M. Weinhold of DuPont entitled, ". . . Part 1—The Printed Circuit Fabrication Process".

This "SIPAD" (Siemens) process applies solder paste onto boards with permanent solder masks, melting the paste and flattening the round, humped solder deposits by a thermal/mechanical process. See FIG. 2 wherein (5) is a pressure plate.

"SIPAD" also requires highly specialized equipment although it can be run in a conventional multilayer press normally used for PCBs. However, this type of press requires about 2000 psi before activation, and though the platens see the top of the solder first, they then contact the PCB itself and thermally shock the laminate, oftentimes scorching and mechanically damaging the solder mask as well. Furthermore, the solder when compressed, squeezes sideways as a very thin film or foil. While this problem can be solved by various techniques to remove the film, it results in extensive and expensive rework and fine droplets of the thus squeezed out solder end up as solder balls.

Since solder "wicking" can be either sideways or upwards, in order for "SIPAD" to achieve maximum densities on fine pitch, the design of the pads must be changed by elongating them. An integrated company can alter their designs but most manufacturers cannot. Wicking upwards is, of course, desirable; sideways is not.

The major problems which both of these processes have attempted to address are the following:
1—opens and shorts due to squeezing out of solder and resultant solder bridging;
2—low packing density and inability to solder with high pin counts without extensive design modifications;
3—the printing of solder paste;
4—achieving the required shape of the deposit;

5—presence of a "bump", the meniscus, makes positioning of fine pitch components difficult resulting in unacceptable tolerances;
6—solder balls;
7—shelf-life of solder joint, short storage times;
8—poor solderability due to too thin deposits; (Hot Air Solder Leveling generally leaves thin deposits, with consequent growth of an intermetallic phase preventing wetting of the SMD solder pads during reflow or wave soldering.)
9—poorly defined soldering gap;
10—inability to quantify and standardize solder deposit and solder gap;
11—yield after soldering; (First-pass yields in standard applications are running at 60–70%, while for many fine pitch cases they are only 10%; rework is extensive.)
12—overall cost; and
13—quality of board and solder joint.

The solutions and benefits both of these approaches have attempted to achieve are as follows:
1—removal of the solder paste printing process from the assembler's operation; (The PCB fabricator can supply to the assembler circuits with a solid, flat solder deposit. New processes can be used to replace solder paste printing and which obviate the need for cleaning the PCB assemblies without the risk of solder balls or other contamination.)
2—guaranteed reflow solderable PCBs;
3—unlimited good solderability of the PCB;
4—small solder structures;
5—a defined solder gap; solder in a defined three-dimensional well, i.e., an excellent profile;
6—assembler would then use a 100% tested presoldered board since faults arising from solder application can be separately controlled, eliminated or reworked at the PCB fabricator without the obstruction of components;
7—the problem of solder paste deposits being deformed when the component terminals touch down is non-existent with this method; (Components can be placed on a flat surface which would permit the use of fine-pitch flat packs and TAB assembly with automated equipment.)
8—finer PCB structures can be implemented;
9—practically no shorts;
10—no solder balls;
11—too thin solder layers are not encountered;
12—fluxing agents can be optimized;
13—unlimited shelf-life between placement and soldering; longer guaranteed storage time; reduction in growth of the intermetallic phase resulting in higher peel strength;
14—the possibility of quantifiable and standardized solder deposits and solder joints;
15—better yield after soldering with considerable reduction of rework; higher first pass yields;
16—better overall quality of boards and solder joints; improved product consistency; and
17—lower cost due to faster throughput in assembly with shorter SMD assembly lines.

Neither of these two processes have been especially successful.

The "SIPAD" process uses solder in the well to solder, not the pillar of "OPTIPAD"; the process of this invention uses both.

In summary, both of these new processes leave much to be desired and are not industrially practical in their present state of development. As a consequence, the study which resulted in this subject invention was undertaken.

SUMMARY OF THE INVENTION

This invention relates to a printed circuit board having solder deposits on the surface mount pads thereof, as well as the solder deposits themselves, such that these deposits are well-formed and contained within the x, y, and z directions of the solder pad without bridging and without degradation of the laminate or the permanent solder mask.

Said solder deposits are formed by covering said printed circuit board with a mesh material, in intimate contact with the mask, as a first compressive surface stretched on a weighted or hinged chase, the latter embodying a second compressive surface to provide uniform compression, heating said compressed printed circuit board uniformly at an elevated temperature sufficient to melt said solder deposits, cooling while compressed and removing said cooled printed circuit board from between the mesh material and the second compressive surface, whereby the solder deposits are thereby formed into a most desirable configuration; and the top surface thereof is impressed with the mesh configuration.

Both compression surfaces can be mesh material itself stretched on a weighted chase, for example, constructed and arranged such that registration is maintained while forming the softened solder.

This invention also embodies the solder deposit itself wherein the solder is deposited by block stencil printing.

Said first solder deposit permits joining with a second solder deposit on a component without squeezing out and short circuiting the soldering connection.

Most problems of the conventional methods and products are resolved. Some of the advantageous effects are: (1) by the use of block stencil printing, the elimination of solder paste printing with all its related problems; (2) a defined solder gap; (3) solder bumps are eliminated; (4) solder deposit is optimized with a top surface more receptive to holding flux; (5) practically no shorts; (6) no solder balls; (7) standardized solder joints are now possible; (8) very high first pass yields; and (9) the use of standard equipment requiring no new investment.

BRIEF DESCRIPTION OF THE DRAWINGS

The invention of the present application will now be described in more detail with reference to the preferred embodiments of the device, given only by way of example, and with reference to the accompanying drawings, in which.

DISCLOSURE OF THE INVENTION

Figure 1:
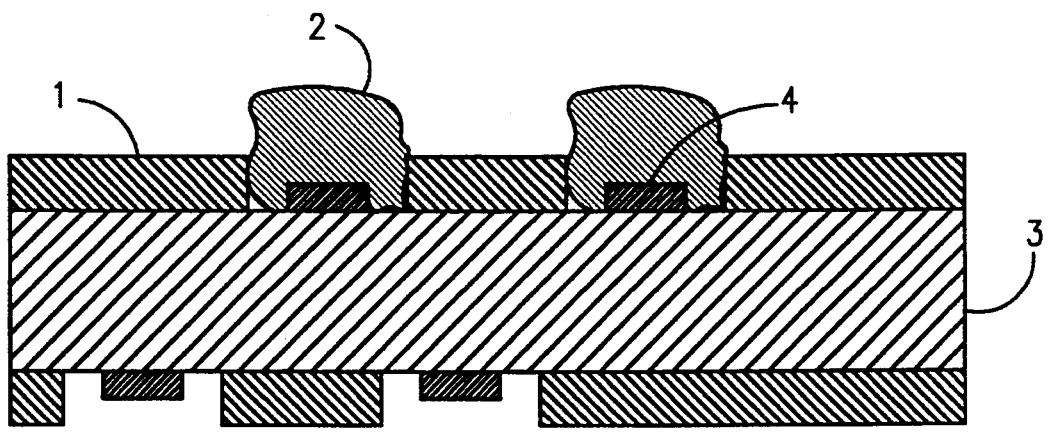
FIG. 1 is a schematic of the Prior Art with the solder or solder paste applied and after reflow.
Figure 2:
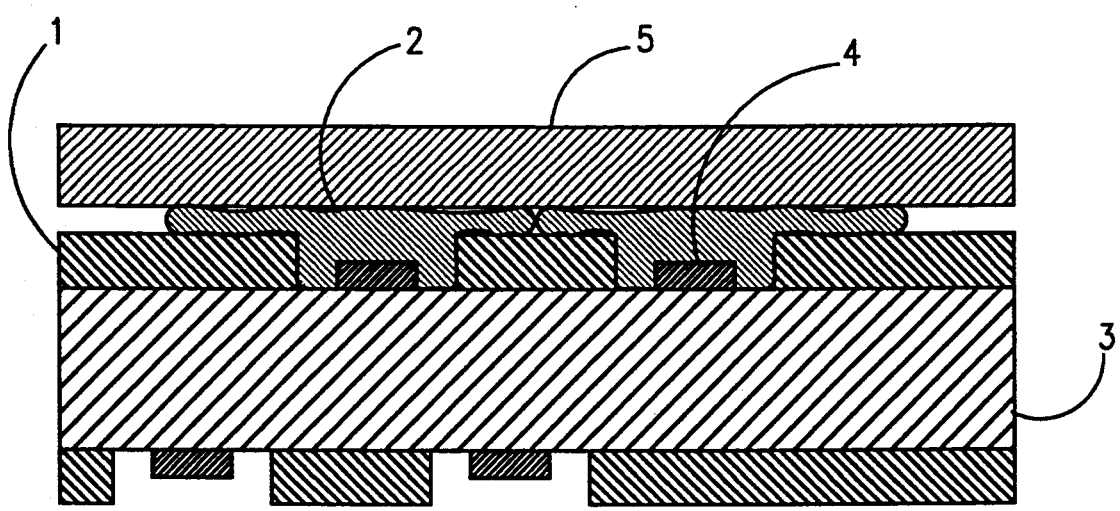
FIG. 2 is a schematic of a Prior Art configuration after flattening.

This formed solder deposit is in a defined three-dimensional well having a desirable profile and a defined solder gap. It is immaterial whether the solder before forming is solid solder or a solder paste. By the placement of a mesh on the surface of the circuit board with the solder in place on the pads, applying a slight positive pressure on a rigid or elastic surface on the other side of the mesh, and subjecting this system to a temperature just low enough to reflow the solder by means of a heat transfer fluid either liquid or gaseous, then cooling the board to solidify the solder, a product results having the above properties. The invention also relates to apparatus for forming this solder deposit.

This invention eliminates most of the problems of other approaches in that by the use of a mesh and uniform heating, dwell time at temperature is short and compressive pressure is slight. With a heat transfer fluid, such as natural oils or synthetic oils or air, all surfaces are in contact at the same time and at the same temperature, thermal decomposition of the laminate does not ensue thereby protecting the printed circuit board including any components from degradation by heat.

With the flattening processes, the boards see one additional soldering; the less they are subjected to heat, the better. Normal soldering techniques do not exert any mechanical force on the boards, but these conventional techniques must; this invention exerts very little.

A feature of this invention is that the heat transfer fluid/mesh technique works regardless of how the original solder deposit is laid down, e.g., by electroplating, by immersion, by screen printing a solder paste, or however. It works as long as the solder is there, be it as solid solder, solder paste, solder cream or solder powder.

Furthermore, the heat transfer fluid includes the property of releasing the surface and mesh from the formed solder.

The advantage of the use of mesh, wherein the mesh material is selected from the group consisting of stainless steels, glass cloths, chemically milled screens, chemically milled plates or laser-machined plates, over the prior art is that it:

1—is a conduit for bubbles, allowing the outgasses to be evacuated.
2—contains the solder deposit in the x, y, and z directions by moving the molten solder upwards and downwards within the mesh.
3—shapes the solder deposit without formation of "bumps".
4—fills the well with solder without squeeze-out.
5—increases pad size slightly thereby presenting an easier "target" for placement of the SMD by containing the molten solder within the approximate periphery of the pad.
6—allows a pad to hold more sticky flux prior to assembly than a perfectly planar one, improving adhesion of components since the grid pattern of the mesh is impressed on the uppermost portion of the formed solid solder; it is not flat.
7—allows variation of the count, as well as the thickness, wire diameter and the weave, consistent with this mesh count of approximately 60–300. While a 60 mesh screen is acceptable for a ground plane, 220 mesh is better for a 20 or 50 mil pitch.
8—creates pad shapes which while irregular, nevertheless, give optimum performance.
9—is being used as a die or mold for the solder or paste and can capture even inordinately high volumes of solder. Therefore, the need to blast off squeeze out or scrub with a stiff nylon bristle brush, possibly damaging the permanent solder mask and requiring extensive rework, is eliminated. Foil formation is eliminated by proper selection of mesh.
10—eliminates the need for thicker (4 mil) or removable (5 mil) solder mask.
11—performs its function whether the substrate is a printed circuit board laminate or a ceramic hybrid circuit board or wherever else solder is applied, so long as the substrate can withstand the temperature, the slight pressure and the environment of the heat transfer fluid.

In one embodiment of this invention, the "bumps", or whatever configuration the surface of the solder deposit is in, contact the plates in the manual apparatus due to the pressure of springs only . . . these springs are actuated by the handle locking and unlocking, this allows circulation of the fluid below them; thus, permitting rapid and intimate heat transfer unlike in the absence of fluid where thermal "shock" is normal because of the intimate contact with very hot metal at relatively high contact pressures. The cycle time, wherein the compressed circuit board is maintained at the elevated temperature, can be as little as 2–5 minutes.

The fixture device is shown in the drawings. The system lends itself easily to automation.

When the bumps are squeezed they assume a shape as a function of the size and shape of the mesh openings and of the weave. As the component is placed (with adhesive or "sticky" flux for example), the board goes to reflow (inert gas, hot air, IR or whatever); the solder, which now is in a shape controlled by the mesh, protrudes above the board thereby "finds" the metal leads which are typically solder or tin, and wets the surface.

Uneven pressure on the plates is not significant so long as they are in planar contact. The surfaces capable of planar compression are selected from the group consisting of metal, plastic, glass and rubber. A sheet of rubberlike deformable material placed between the mesh material and the surfaces capable of planar compression improves performance only slightly. However, in the case where the mesh itself is the surface capable of planar compression, a sheet of rubberlike material is unnecessary, the excess solder balls rise through the top of the mesh.

The spring pressure is very modest; the springs used can easily be compressed by hand; too much pressure will produce squeeze out. The compressing is done at a pressure just sufficient to form the softened solder. Alternatively, electromechanical, pneumatic or hydraulic-actuated systems could vary this slight pressure to adjust to part numbers with varying configurations if required.

The concept of this invention is to lock-in the volume element into which the solder can travel thereby preventing sideways squeezing while promoting squeezing upwards as well as downwards should there be insufficient solder in the well. The solder is then formed in a most desirable configuration. The mesh material may be of conventional stainless steel wires, glass cloth or a chemical milled screen or even a laser-machined plate in a configuration so that it behaves like a screen preventing sideways flow and promoting flow upward.

The main features being that the spreading of solder is prevented, solder balls do not form, the well is filled, low volume solder deposits are optimized and all this is done at an exposure to a rapid and uniform low temperature thereby preventing deterioration of the mask and the board.

Assembly operations today are fully automated except for the application of solder paste. The solder paste itself consists of balls of solder essentially held together in a system with about 10-50% solvent-carrier. The paste has a relatively short shelf-life aggravating the problems in its handling. Wave soldering is not a solution since many components cannot be subjected to wave conditions. Furthermore, conventional wave soldering generates a "shadow" when the leads are facing the wave head-on making component soldering difficult unless double soldering is employed. This invention is independent of whether the solder has been applied by wave, bar or laser techniques.

In a typical conventional process, solder paste is screened onto the bumpy surface; a pick-and-place machine places the components and the machine stops when in contact with the bumps. However, in low pitch applications, the solder paste deposit will displace sideways and contact another bump shorting the circuit.

Getting paste out of assembly increases productivity greatly due to its automatic nature, save for the paste application. Reflow is speeded up and simplified since the impurities in the paste, which cause outgassing and produce solder balls, are already removed.

This process not only eliminates solder balls and squeeze out of excess solder, but even shapes the excess solder into a more desirable form for the mating with surface mount components. Furthermore, the well is filled, any outgassing is controlled and should little solder be present, it is formed to optimize its volume. Additionally, there is no need to modify board design, i.e., land configurations, solder mask or stencil artwork, etc., currently used; the method and apparatus accomodates itself to existing topographies.

Figure 3:
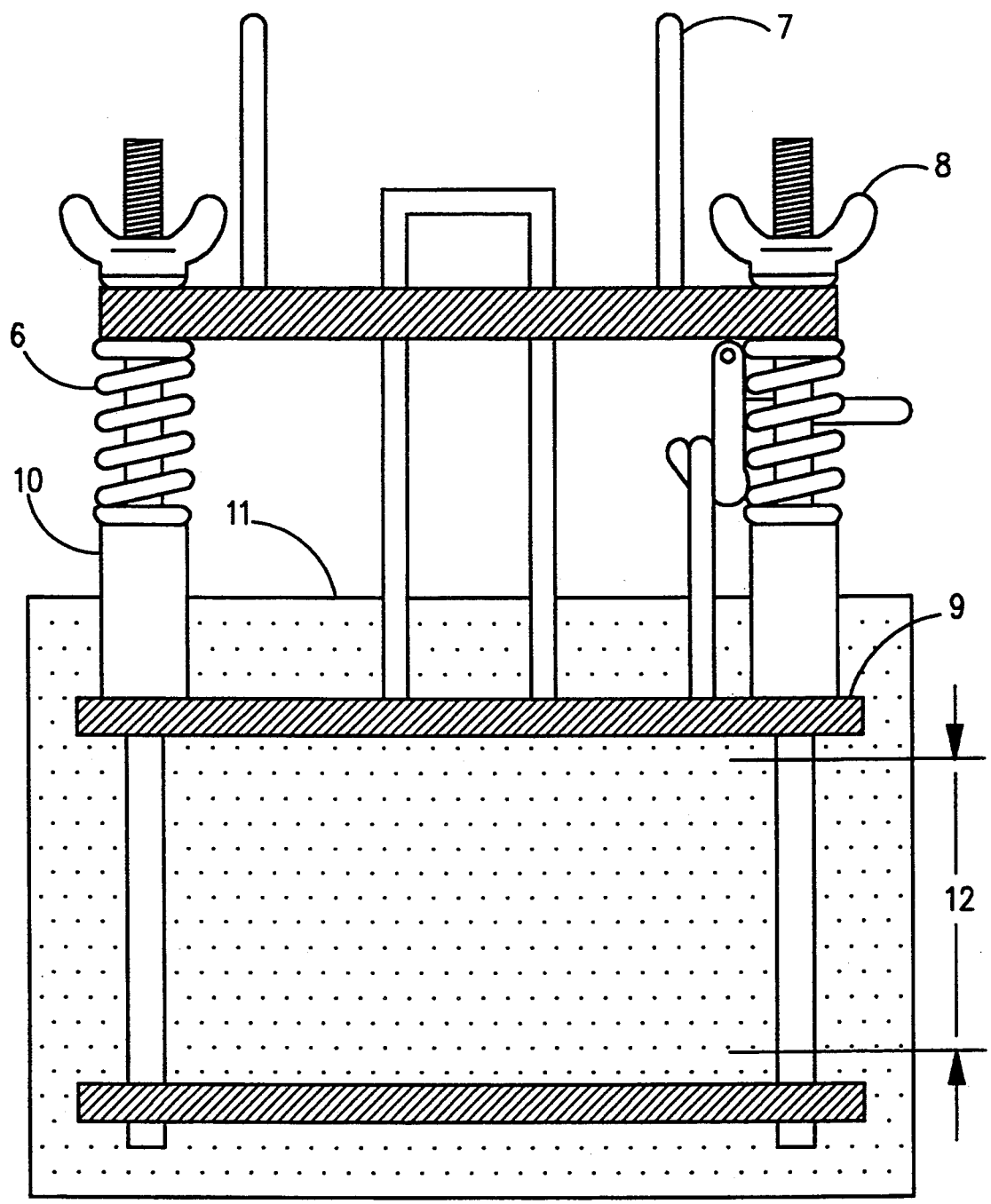
FIG. 3 is a schematic of one fixture used in this invention for simultaneously heating and compressing the PCB.
Figure 4:
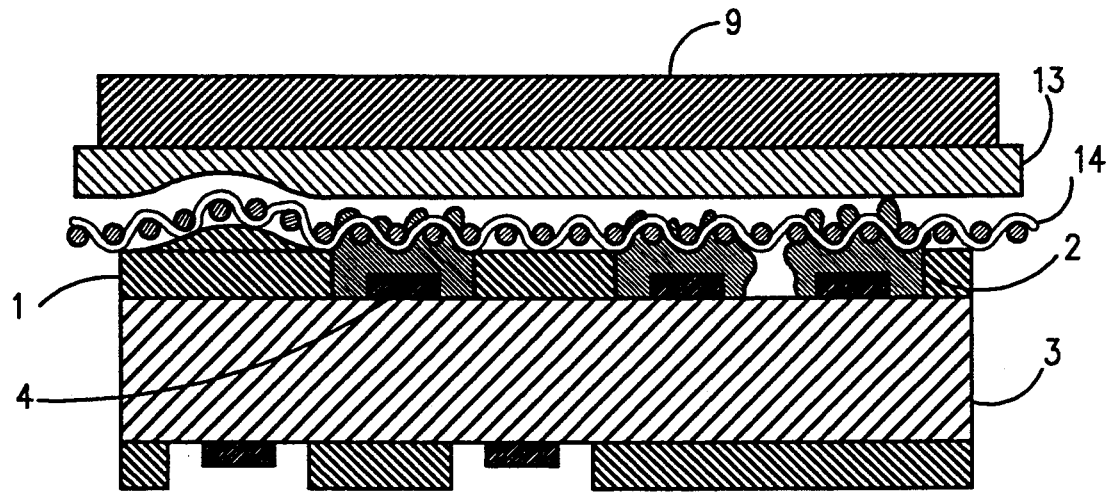
FIG. 4 is a cross-section of the sandwich of this invention after closure.
Figure 5:
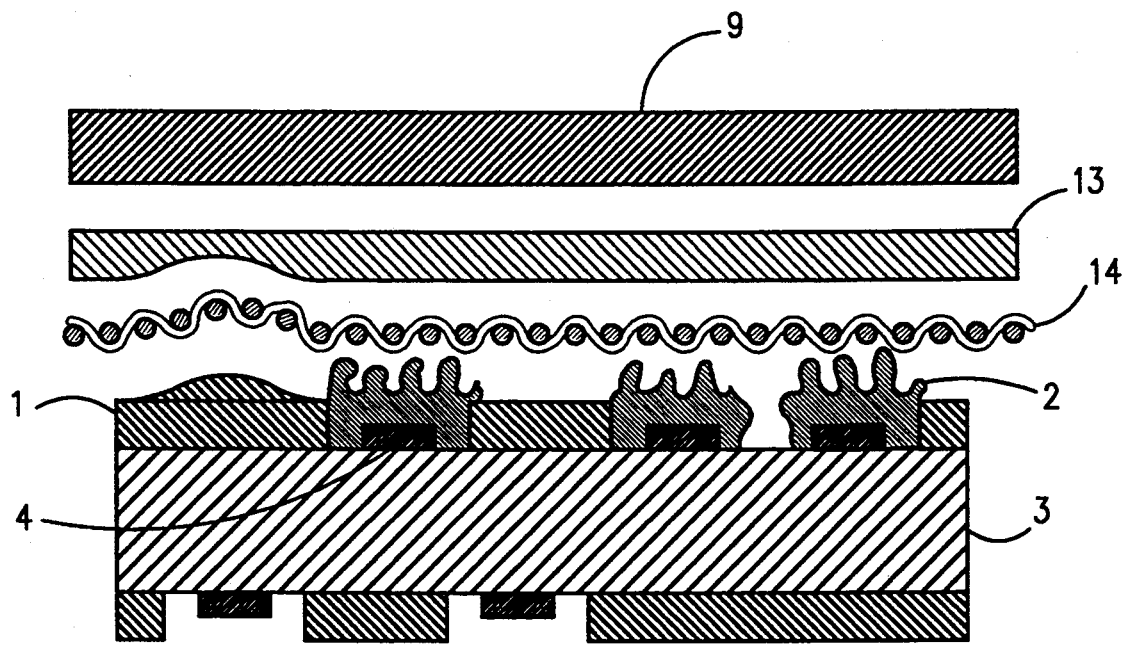
FIG. 5 is a cross-section of the sandwich of this invention prior to closure.
Figure 6:
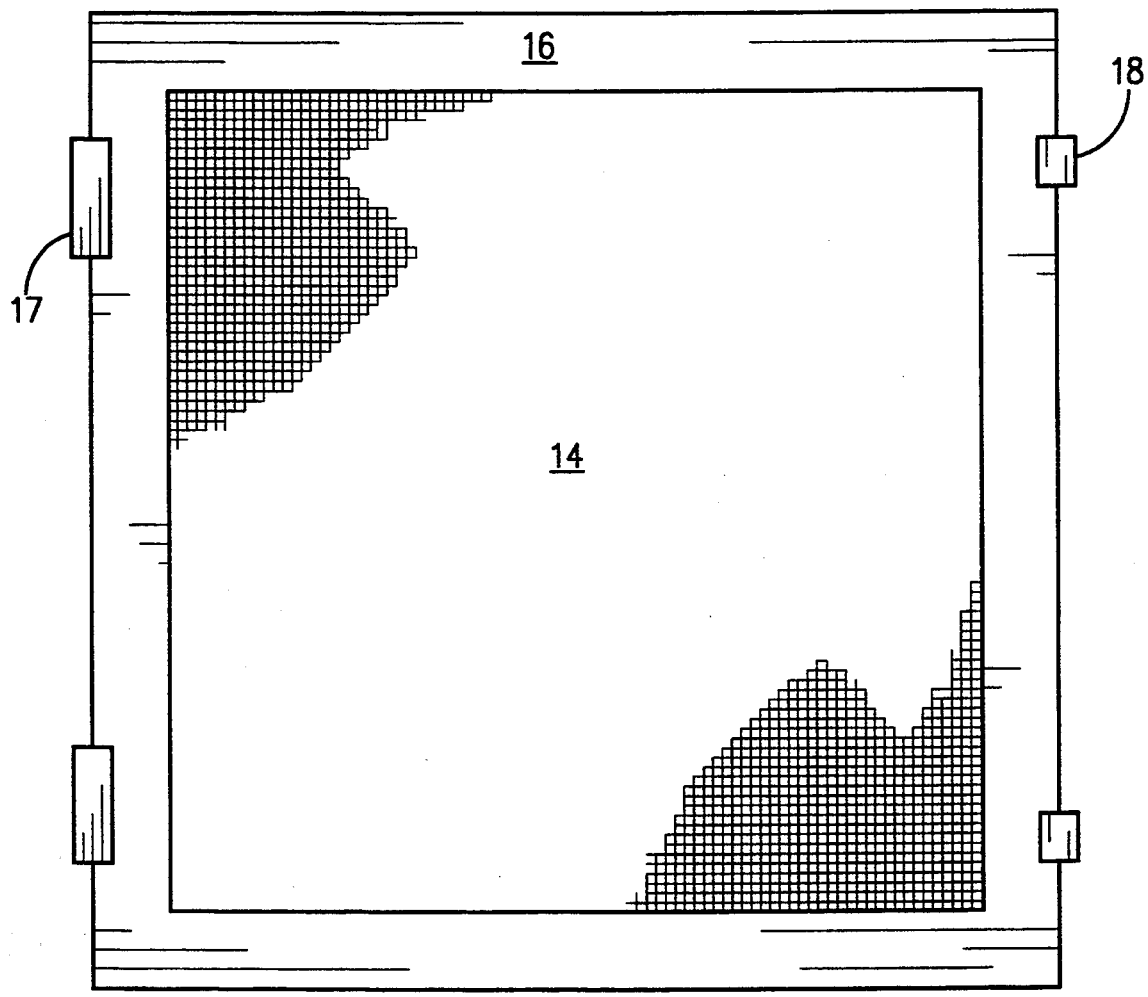
FIG. 6 is a schematic top view of a screen frame and the chase with mesh in place of another fixture used in this invention.
Figure 7:
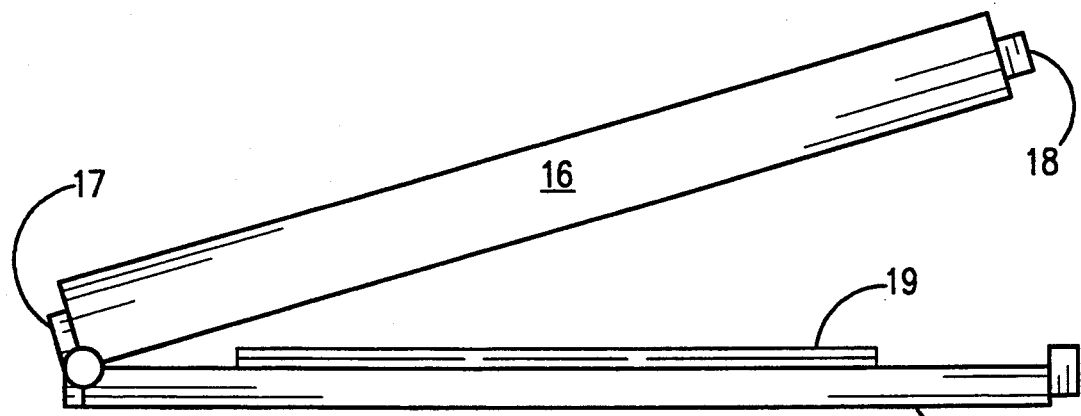
FIG. 7 is a side view of FIG. 6 with a PCB in place.
Figure 8:
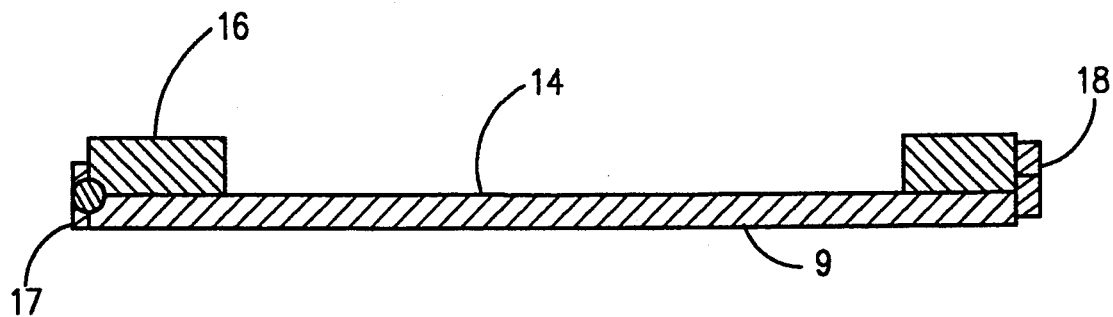
FIG. 8 is a cut-a-way sectional view with the mesh lowered without a PCB.
Figure 9:
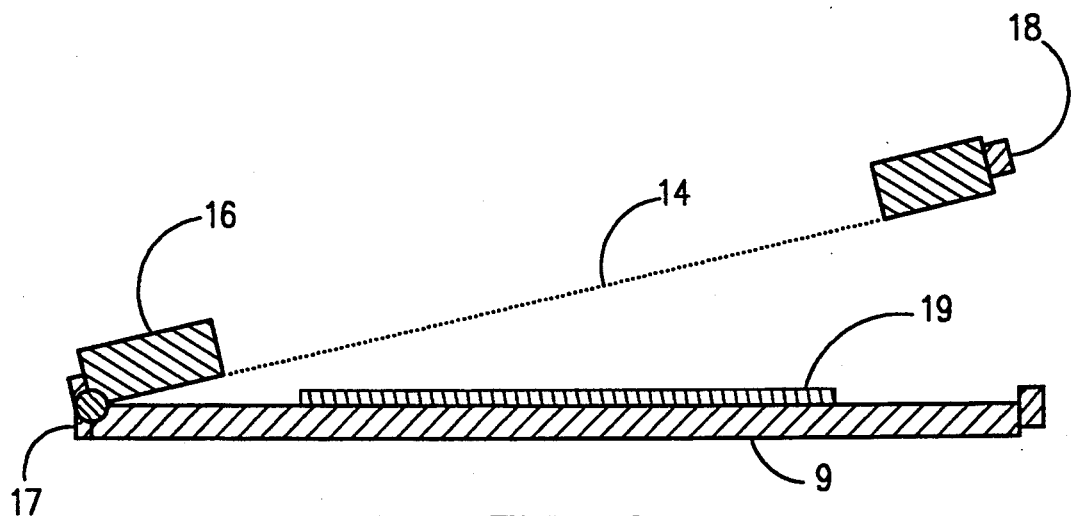
FIG. 9 is a cut-a-way sectional view of the chase with the mesh raised and a PCB in place.
Figure 10:
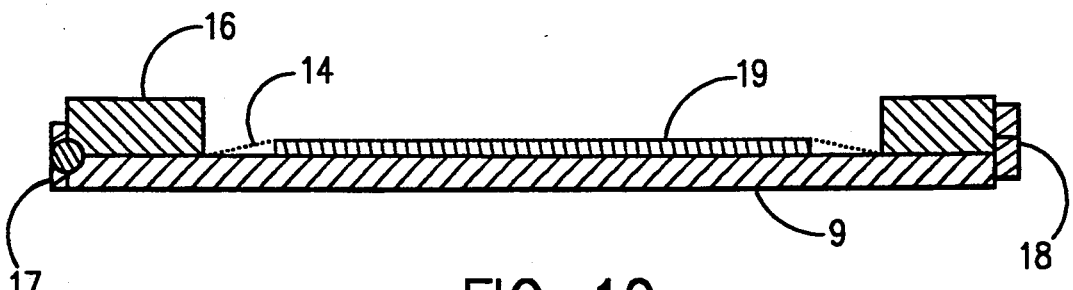
FIG. 10 is a cut-a-way sectional view with the mesh compressed and in contact with the surface of the PCB.

This investigation sought to mitigate this harsh metal contact by the use of a heat transfer fluid (a hot synthetic oil in most cases) and the substitution of various pressure and auxiliary plates, the auxiliary "plates" being polymer or rubber interfaces between the pressure plate and the PCB. FIG. 3 is a schematic of one fixture of this invention (in a tank of heat transfer fluid) used to contain the PCB sandwich, in which reference numeral (6) represents the springs, (7) stainless steel rods, (8) fastener nuts, (9) aluminum pressure plates, (10) shims to keep the springs out of the heat transfer fluid, and (11) and (12) openings for receiving the PCB sandwich. FIG. 4 is a cross-section schematic of the PCB sandwich of this invention after closure, while FIG. 5 is a cross-section of the sandwich in the open position. Referring to these figures, (15) is a gap, i.e., an open area between the pads where no solder dam is required, (2) is solder, (1) a permanent mask, (4) a pad, (3) is laminate, (14) mesh, (13) a sheet of rubber and (9) an aluminum planar plate.

The following working examples are illustrative of the present invention:

TABLE I

VARIABLES EVALUATED IN FORMING THE SOLDER DEPOSIT

| CONTACT FILM | RESULTS |
| --- | --- |
| "KAPTON" | foil formation |
| 4 mil "VACREL" | in a vacuum laminator; foil formation and severe curing and blistering of the "VACREL" |
| Rubber Bladder | in a vacuum laminator; foil formation and rubber residue on PCB |
| Silicone Rubber | in a vacuum laminator; foil formation with no rubber residue |
| Aluminum Foil | solder foil formed with wrinkles |
| Aluminum Plates | foil formation and galvanized-like dull finish on the solder |
| Aluminum Plates (highly polished) | foil formation, solder finish was fine |
| Stainless Steel Plates | foil formation and the grain of the highly polished steel appeared on the solder; also required longer than normal dwell and cool-down time |
| Glass Plates | produced a shiny and reflective solder surface; one could see the outgassing and foil formation as it developed |

A-These experiments employed reflowed solder paste on the board with stainless steel plates (pressure transmitting surface unless otherwise noted) using a standard PCB in the test fixture, which was immersed in hot heat transfer fluid (a synthetic oil except in the vacuum laminator experiments wherein the fluid was air), at a temperature of 395 degrees F. unless otherwise noted.

B—In these experiments the temperature was varied, in degrees F., they were: 450, 425, 405 and 390. Temperatures from the softening point of solder to 405 degrees are adequate. The elevated temperature can be maintained between about 370–420 degrees Fahrenheit, sufficient to soften the solder, solder paste, solder cream or solder powder.

C—Dwell times were varied at intervals in minutes of 1, 2, 3, 4, and 5. Two to three minutes appeared to be all that was necessary, although boards thicker than the standard 0.064 in., i.e., up to 0.125 in., took the full 4–5 minutes. These experiments were performed in a batch system. In a continuous process, when the boards were heated in a hot air reflow oven ( wherein air is the heat transfer medium) about 20 minutes were required not only due to the length of commercial ovens, but due to the need to heat up the fixture and the compression plates.

To review the above:

1—With reflowed paste and a "KAPTON" film (a DuPont trademarked product) to contain solder squeeze out, plus the metal plates, solder foil formed anyway.

2—With lamination in a commercial Solder Mask Vacuum Laminator of a 4 mil "VACREL" 8040 (a DuPont trademarked product widely used as a dry film resist) temporary film over the permanent 2.5 mil 8040, extensive squeeze out occurred and severe curing and blistering of the temporary film so that it could not be removed.

3—Vacuum Lamination using a rubber bladder backed up by plates, again resulted in extensive foil formation and a rubber residue remained on the board. Proper selection of a high temperature silicone rubber solves the deposition problem but not the squeeze out.

4—Aluminum Foil-foil formation and wrinkles in the solder;

5—Aluminum Plates-foil formation and galvanized, dull-looking finish on the solder; highly polished aluminum resolved the finish problem.

6—Stainless Steel Plates-foil formation and the grain of the highly polished steel plates were on the solder; also required longer dwell time and cool-down due to its heat transfer characteristic.

7—Glass Plates—produced a shiny and reflective solder surface. One could observe the outgassing and the foil formation as it developed.

During the course of these experiments fluid temperatures and cycle times were varied without any significant beneficial effect. It should be mentioned that when there was foil formation, oftentimes an 1100 psi water spray would remove it . . . but usually incompletely. Any remaining small specks of solder would convert to solder balls upon reflow potentially causing shorts on assembled boards.

D—The use of a mesh covering the surface of the board resolved the problems of bubbles from outgassing, foil formation, discoloration of the solder, as well as an excess or deficiency of solder on the pad. All the above experiments were repeated using mesh and the same benefits were achieved. By using mesh both top and bottom as the compression media, this heat up time was significantly reduced. See FIGS. 6 to 10 wherein (14) is mesh, (16) a screen frame, (17) a hinge, (18) a latch, and (19) a PCB. Even in a continuous process, this time can be reduced further still if the mesh only is heated by electrical means or laser means or however. These results were also achieved not only with solid solder and solid solder resulting from the reflow of solder paste, but also from solder paste which had not been reflowed.

Furthermore, 10 mil pitch cannot be screen printed efficiently at all . . . it is usual for fabricators to rework about 70% of the leads at the present state of technology. Block stencil printing, however, eliminates the need for low pitch screen printing completely. By stenciling a block of pads with solder, that is, by creating a mass of short circuits and then removing the shorts with this mesh technology, since the excess solder does not wet the mask, 10 mil pitch is readily achieved.

Manufacturers of solder pastes have been spending considerable effort over the last several years in improving the pastes to allow higher yields in printing fine pitch. In particular, they have been centrifuging to obtain solder in the paste in the particle size range of 15–25 microns which represents only about 4% of their starting material. Consequently, the cost of these specially treated pastes has risen greatly. With this invention, the technology of the solder paste properties is removed and inexpensive older technology pastes can now be effectively used.

The conclusions from these experiments follow.

1—Any planar pressure plate alone causes squeeze-out (foil formation) so long as there is excess solder present. In these experiments, our pressure plate is probably a film of hot heat transfer fluid.

2—The ideal situation is to conduct the forming rapidly and at as uniform a rate of heat rise as possible, adequate to reflow the solder while not shocking and scorching the laminate or curing a temporary mask . . . 385–405 degrees F. seems to be optimum. Cycle times were normally of the order of 2-3 minutes.

3—Reflowed solder with a shiny surface is apparently the most desirable, reflecting no change in the eutectic ratio of optimum Sn/Pb composition. A dull surface usually means either oxidation of the solder or an enrichment of Pb at the surface.

4—What is required is something to prevent squeeze-out, something which is not a continuous planar pressure plate. The use of mesh satisfied all the requirements.

DESCRIPTION OF THE PREFERRED EMBODIMENTS

The heat transfer fluid/mesh technique of the preferred embodiments has five major features:

1—uniform heating at a temperature only slightly above the melting of the solder;

2—gentle application pressure;

3—protection of the laminate, the board and the permanent solder mask during the forming of the solder;

4—the release agent character of the fluid allowing easy separation of the mesh from the solid solder after cool-down; and 5—the ability to maintain a proper form of the solder despite variations in the amount present.

The results achieved in this invention were the outcome of a stepwise development program which encountered a number of failures though many of these failures themselves may be considered to be improvements over current technology.

The most significant development, i.e., the use of a MESH covering the surface of the board, immediately gave excellent results. Not only did the foil not appear, but as important, the mesh not only caused the excess solder to rise up, but to flow down the well thereby forming a most desirable solder configuration.

In a preferred embodiment of this invention, a printed circuit board having solder deposits formed on the surface mount pads thereof said solder deposits are formed by a process comprising the steps of covering said board with a mesh material; placing said board with the mesh thereon between surfaces capable of uniform compression; compressing; placing said compressed circuit board at any orientation in a heat transfer fluid medium maintained at an elevated temperature whereby the solder melts; removing said circuit board from the medium; cooling said circuit board to ambient temperature while compressed; and removing said circuit board from between the compressive surfaces and the mesh.

In another embodiment, said solder deposits are formed by covering said printed circuit board with a mesh material as a first compressive surface stretched on a weighted or hinged chase the latter embodying a second compressive surface to provide uniform compression, constructed and arranged such that registration (i.e., to maintain the printed image of the solder paste without distortion while bringing the mesh in contact with all surfaces simultaneously) is maintained while forming the softened solder, heating said compressed printed circuit board uniformly at an elevated temperature sufficient to melt said solder deposits, cooling and removing said cooled printed circuit board from between the mesh material and the second compressive surface.

In a further embodiment, the second compressive surface is also mesh, with less mass to be heated residence time at temperature is shortened.

In still another embodiment of this invention the solder deposit itself comprises: solder deposited on surface mount pads of a circuit board; heating means and mesh means for forming said solder to permit joining with a second solder deposit on a component without squeezing out and short circuiting said soldering connection.

In yet another embodiment of this invention, rather than screening, stenciling provided at least equivalent performance without the need for precise registration. With stencils, one can squeegee a relatively uniform thickness of paste over a large enough area to encompass a number of SMD pads; these blocks of pads can be covered with solder as a unit. Such PCBs are always only partially loaded with SMD pads. When the solder melts, the excess balls-up, and since it does not wet the solder mask, it rolls off the mesh leaving near-perfectly formed solid solder deposits with a high degree of coplanarity. Thus, not only are screen printing and registration problems eliminated, but rework is simplified by using the same technique ... no special rework tool is required. It should be noted that the mesh ought to be in contact with the solder mask to inhibit the solder on the pads from wicking-up excess solder.

This mesh technique, as evidenced by micro-sectioning, resulted in filling the well assuring one of a superior solder joint. The height of the thus formed solder will also require less pressure to achieve wetting of the surface mount component. Incidentally, while all that is needed is to lay the mesh on the board surface, a slight tension on the mesh produces an improvement.

The pressure required in the fixture can easily be achieved by hand. The use of a rubber sheet between the mesh and the pressure plate resulted in a slight further improvement due to its ability to conform to the topography of the board. It did appear to be beneficial with low solder deposits by preventing the solder to rise too far, and made it easier to peel the board off at the end of the treatment.

In all the above experiments, utilizing the mesh on reflowed solder similarly gave excellent results.

Subsequently, an experiment was run wherein a screened solder paste, without being reflowed, was covered with mesh, placed in the fixture and subjected to the hot heat transfer fluid under pressure. The results were also excellent. Not only was there no squeeze out, but the solder was well-formed and especially shiny. Microsections confirmed the results and verify that the solder filled the well.

The impact of this experiment is important. Instead of adding three additional soldering steps over the conventional approach, i.e., reflowing each side separately and then an additional soldering/forming step with subsequent soldering to attach the components; now only one additional soldering is needed if solder paste deposits on both sides are originally reflowed and formed at the same time.

An additional observation should be recorded. Although the cooling can be done by placing the heated, compressed circuit board in heat transfer media of progressively lower temperatures, the reflowed formed board should be quenched quickly. Quenching is reported to be metallurgically necessary for the following reasons: (a) copper reportedly produces two intermediate phases or intermetallic zones between the Cu and the Sn—Pb alloy ... $Cu_3Sn$ and $Cu_6Sn_5$, which zones can make soldering difficult and in the extreme, impossible; (b) growth of this zone accelerates as a function of the temperature and the time at elevated temperatures; (c) excessive growth of this zone lessens ductility of the resultant Sn layer. Therefore, a short dwell time and a quick cool down are the primary objectives, and the process of this invention using the mesh clearly satisfies this requirement.

In this invention, the quick cool down is easily achieved in ambient air merely by removing the loaded fixture from the heat transfer fluid. Should the capacity of any production heat treating receptacle require a varying quench, this can readily be realized by having receptacles of varying temperatures in series.

The foregoing description of the specific embodiments will so fully reveal the general nature of the invention that others can, by applying current knowledge, readily modify and/or adapt for various applications such specific embodiments without departing from the generic concept, and, therefore, such modifications and adaptations should and are intended to be comprehended within the meaning and range of equivalents of the disclosed embodiments. It is to be understood that the phraseology or terminology employed herein is for the purpose of description and not of limitation.

What is claimed is:

1. A printed circuit board having solder deposits on surface mount pads thereof said solder deposits formed by a process comprising the steps of:
    a) providing said printed circuit board having solder deposited on the surface mount pads;
    b) covering said board with a mesh material;
    c) placing said board with the mesh thereon between surfaces capable of uniform compression of said board;
    d) compressing said board having the mesh in intimate contact with said board;
    e) placing the compressed circuit board at any orientation in a heat transfer fluid medium maintained at an elevated temperature whereby the solder melts;
    f) removing said circuit board from the medium;
    g) cooling said circuit board to ambient temperature while compressed whereby the thus melted solder solidifies within the x, y, and z directions of the surface mount pads and the top surface of the thus solidified solder is imprinted with the mesh configuration; and
    h) removing said circuit board from between the compressive surfaces and the mesh.

2. The product of claim 1 wherein one of the surfaces capable of uniform compression of said board is the mesh material itself stretched on a weighted chase constructed and arranged such that registration is maintained while forming the thus melted solder.

3. The product of claim 1 wherein both surfaces capable of uniform compression of said board are the mesh material.

4. A printed circuit board having surface mount pads thereon comprising:
    a) said printed circuit board;
    b) solder deposits on said surface mount pads of said printed circuit board; and
    c) said solder deposits formed by covering said printed circuit board with a mesh material as a first compressive surface stretched on a weighted or hinged chase the latter embodying a second compressive surface to provide uniform compression, heating the compressed printed circuit board uniformly at an elevated temperature sufficient to melt said solder deposits, cooling whereby the thus melted solder solidifies within the x, y, and z directions of said surface mount pads and the top surface of the thus solidified solder is imprinted with the mesh configuration, and removing said cooled printed circuit board from between the mesh material and the second compressive surface.

5. The printed circuit board of claim 4 wherein said solder deposits are deposited by block stencil printing.

6. A solder deposit comprising:

a) solder deposited on surface mount pads of a circuit board;
b) heating means for softening said solder; and
b) mesh means, in compressive contact with said heated solder, for forming and containing said solder within said pads and imprinting the mesh means configuration on the top surface of the solder deposit.

* * * * *